United States Patent
Sharma

(10) Patent No.: US 7,124,392 B2
(45) Date of Patent: Oct. 17, 2006

(54) MAPPING OF PROGRAMMABLE LOGIC DEVICES

(75) Inventor: Sunil Kumar Sharma, Noida (IN)

(73) Assignee: STMicroelectronics, Pvt. Ltd., (IN)

( * ) Notice: Subject to any disclaimer, the term of this patent is extended or adjusted under 35 U.S.C. 154(b) by 181 days.

(21) Appl. No.: 10/675,908

(22) Filed: Sep. 29, 2003

(65) Prior Publication Data

US 2004/0133869 A1    Jul. 8, 2004

(30) Foreign Application Priority Data

Sep. 27, 2002    (IN) .................................. 993/02

(51) Int. Cl.
*G06F 17/50* (2006.01)
(52) U.S. Cl. ............................. 716/17; 716/16; 716/18
(58) Field of Classification Search ............. 716/16–18
See application file for complete search history.

(56) References Cited

U.S. PATENT DOCUMENTS

| | | | | |
|---|---|---|---|---|
| 5,946,219 | A * | 8/1999 | Mason et al. ................. | 716/16 |
| 6,212,670 | B1 * | 4/2001 | Kaviani ....................... | 716/17 |
| 6,216,257 | B1 * | 4/2001 | Agrawal et al. .............. | 716/16 |
| 6,336,208 | B1 * | 1/2002 | Mohan et al. ................ | 716/16 |
| 6,470,485 | B1 * | 10/2002 | Cote et al. .................... | 716/16 |
| 6,490,717 | B1 * | 12/2002 | Pedersen et al. ............. | 716/18 |
| 6,725,442 | B1 * | 4/2004 | Cote et al. .................... | 716/16 |

OTHER PUBLICATIONS

Kuang-Chien Chen, Jason Cong, Yuzheng Ding, Andrew Kahng, Peter Trajmar; *DAG-Map: Graph Based FPGA Technology Mapping For Delay Optimization*; IEEE Design and test of computers, pp. 7-20, Sep. 1992.

Jason Cong and Yuzheng Ding; *An Optimal Technology Mapping Algorithm for Delay Optimization in Lookup-Table Based FPGA Designs*; IEEE Trans. On Computer Aided Design of Integrated Circuits and Systems CAD, vol. 13, pp. 1-12 Jan. 1994.

Jason Cong and Yuzheng Ding; *On Area/Depth Trade-off in LUT-Based FPGA Technology Mapping*; 30th ACM/IEEE design Automation Conference (DAC), pp. 213-218, 1993.

Jason Cong and Yuzheng Ding; *Beyond the Combinatorial Limit in Depth Minimization for LUT-Based FPGA Designs*; IEEE/ACM International Conference on Computer Aided Design (ICCAD), pp. 110-114, Nov. 1993.

* cited by examiner

*Primary Examiner*—Stacy A. Whitmore
(74) *Attorney, Agent, or Firm*—Lisa K. Jorgenson; Graybeal Jackson Haley; Paul F. Rusyn

(57) ABSTRACT

A method for mapping an electronic digital circuit to a Look Up table (LUT) based Programmable Logic Deviceoperates by selecting an unmapped or partially mapped LUT, and identifying a group of circuit elements for mapping on the selected LUT based on the available capacity of the selected LUT and the mapping constraints. The identified circuit elements are mapped onto the selected LUT. The identification of circuit elements and mapping is carried out while taking into consideration the Cascade Logic associated with the selected LUT. The process continues until all circuit elements have been mapped. The group of circuit elements is mapped to the cascade logic prior to mapping on the LUTs. Conversely, the cascade logic is incorporated only after all circuit elements have initially been mapped onto LUTs or some elements remain unmapped after all LUTs have been utilized. The mapping constraints include timing, placement, and size constraints.

18 Claims, 8 Drawing Sheets

MAPPING OF PROGRAMMABLE LOGIC DEVICES

PRIORITY CLAIM

This application claims priority from Indian patent application No. 993/Del/2002, filed Sep. 27, 2002, which is incorporated herein by reference.

TECHNICAL FIELD

This invention relates to an improved method and system for mapping an electronic circuit to a programmable logic device (PLD). In particular, the invention relates to the utilization of cascade logic elements while mapping.

BACKGROUND

Programmable Logic Devices (PLDs) provide the capability of implementing a wide range of electronic circuits using the same physical device. This capability is exploited by configuring the device appropriately for each desired application. The configuring process involves the mapping of the target circuit onto the available resources of the PLD. Programmable Gate Arrays (PGAs) and Field Programmable Gate Arrays (FPGAS) are the most widely used PLDs. The architecture of these devices incorporates Look Up Tables (LUTS) that are configured for desired functionality. The efficiency of mapping algorithms is critical to the effective utilization of PGAs and FPGAs. In LUT-based FPGAs the mapping is implemented on the LUTs.

The conventional LUT-based FPGA mapping algorithms can be divided into two classes. The algorithms in the first class emphasize the minimization of the number of LUTs in the solution. This class includes "Chortle" and "Chortle-crf" algorithms by Francis, based on tree decomposition and bin packing techniques. The algorithms in the second class emphasize the minimization of the delay of the solution. This class includes "Flowmap" by Cong and Y. Ding, which use flow based techniques in mapping with node duplication to reduce the logical depth of the mapped netlist. See Jason Cong and Yuzheng Ding; An Optimal Technology Mapping Algorithm for Delay Optimization in Lookup-Table Based FPGA Designs; IEEE Trans. On Computer Aided Design of Integrated Circuits and Systems CAD, Vol. 13, pp 1–12 Jan. 1994.

A DAG-map (Direct Analysis Graph) method for FPGA technology mapping for delay optimization has been proposed by J. Cong et.al. See Kuang-Chien Chen, Jason Cong, Yuzheng Ding, Andrew Kahng, Peter Trajmar; DAG-Map: Graph Based FPGA Technology Mapping For Delay Optimization; IEEE Design and test of computers, pp 7–20, September 1992. This method utilizes a graph based technology mapping algorithm "DAG-Map", for delay optimization in lookup-table based FPGA designs. The algorithm carries out technology mapping and delay optimization on the entire Boolean network. As a preprocessing step in "DAG-Map", a general algorithm transforms an arbitrary n-input network into a two-input network with a corresponding increase in the network depth; Finally, a graph matching based technique which performs area optimization without increasing the network delay is used as a post processing step for "DAG-Map". This method does not however utilize the cascade elements available with each LUT in the FPGA.

Another optimal technology mapping algorithm for delay optimization in Lookup -Table based FPGA Designs has been proposed by Jason Cong et. al. See Jason Cong and Yuzheng Ding; An Optimal Technology Mapping Algorithm for Delay Optimization in Lookup-Table Based FPGA Designs; IEEE Trans. On Computer Aided Design of Integrated Circuits and Systems CAD, Vol. 13, pp 1–12 January 1994. This method proposes a polynomial time technology-mapping algorithm, called "Flow-Map", that optimally solves the LUT-based FPGA technology-mapping problem for depth minimization for general Boolean networks. A key step in "Flow-Map" is the computation of a minimum height K-feasible cut in a network, by network flow computation. This algorithm does effectively minimize the number of LUTs by maximizing the volume of each cut and by several post processing operations but it does not utilize the cascade elements with the LUT to further reduce the size of the logic.

A method for On Area/Depth Trade-off in LUT-Based FPGA Technology mapping has been disclosed in reference by Jason Cong and Yuzheng Ding. Jason Cong and Yuzheng Ding; On Area/Depth Trade-off in LUT-Based FPGA Technology Mapping; 30th ACM/IEEE design Automation Conference (DAC), pp. 213–218, 1993. In this method the area and depth trade off in LUT based FPGA technology mapping is proposed by performing a number of depth relaxation operations to obtain a new network with bounded increase in depth and advantageous for subsequent re-mapping for area minimization. The resulting network is then re-mapped to obtain an area-minimized mapping solution. By gradually increasing the depth bound for each design a set of mapping solutions with smooth area and depth trade-off is achieved. For the area minimization step, an optimal algorithm for computing an area-minimum mapping solution without node duplication is developed. However this method also does not talk about the area minimization by utilizing the cascade elements with each LUT.

Another method proposed by Jason Cong and Yuzheng Ding proposes an integrated approach to synthesis and mapping that extends the combinatorial limit set up by the depth-optimal "Flow Map" algorithm. See Jason Cong and Yuzheng Ding; Beyond the Combinatorial Limit in Depth Minimization for LUT-Based FPGA Designs; IEEE/ACM International Conference on Computer Aided Design (IC-CAD), pp. 110–114, November 1993. The new algorithm, "FlowSYN", uses global combinatorial optimization techniques to guide the Boolean synthesis process during depth minimization. The combinatorial optimization is achieved by computing a series of minimum cuts of fixed heights in a network based on fast network flow computation, and the Boolean optimization is achieved by efficient OBDD-based implementation of functional decomposition. This method also does not utilize cascade elements.

SUMMARY

One aspect of this invention is to provide an algorithm for efficiently synthesizing electronic circuits by utilizing cascade elements in LUT-based FPGAs.

Another aspect of the invention is to provide a method and mechanism for maximum utilization of on-chip resources in LUT-based FPGAs hence reducing the area in logic device.

Yet another aspect of the invention is to provide a method for synthesizing a logic circuit with minimum depth in LUT-based FPGAs.

It is yet another aspect of the invention is to provide a method for realizing faster LUT-based FPGA implementation.

The described embodiments of this invention provide an improved method for mapping an electronic digital circuit to a Look Up table (LUT) based Programmable Logic Device (PLD). The method operates by selecting an unmapped or partially mapped LUT, and identifying a group of circuit elements for mapping on the selected LUT based on the available capacity of the selected LUT and the mapping constraints. The identified circuit elements are then mapped onto the selected LUT. The identification of circuit elements and mapping is carried out while taking into consideration the Cascade Logic associated with the selected LUT. The process is continued until all the circuit elements have been mapped. The group of circuit elements is mapped to the cascade logic prior to mapping on the LUTs. Conversely, the cascade logic is incorporated only after either all circuit elements have initially been mapped onto LUTs or some circuit elements remain unmapped even after all LUTs have been utilized. The mapping constraints include timing constraints, placement constraints, and size constraints.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

The following description is based on the definition of technical terms given below:

Electronic design includes the logical structure of an electronic device such as an integrated circuit. This may be specified either as a behavioral description, as high-level Boolean equations, a circuit schematic or in any other form representing the logical arrangements of a device. It may include different constraints such as timing constraints, placement constraints, or mapping constraints, etc.

A Target hardware device includes the hardware device on which an electronic design is implemented. In context of this invention, a target hardware device typically includes the symmetric array of uncommitted logic elements. The uncommitted elements consist of the LUT, cascade gate, MUXes and flip-flops. These elements are grouped to form another hierarchy called programmable logic blocks, which are again grouped to form a programmable logic device.

A Compiler includes software and hardware on which the software operates for compiling the electronics design. The function of the compiler is to synthesize the netlist and map the netlist (design) to the target device.

Mapping refers to the process of grouping gates from a gate netlist or other hardware independent representation of logic into a logic block. In other words, the logic design may be divided into clusters representing the various logic functions within the design. These clusters are mapped onto the uncommitted logic elements in the programmable logic device during the compilation of the electronic design. The conditions for grouping (mapping) the gates into logic cells is that it should be possible to implement the grouped gates in the logic cell, For example, if a four input LUT is taken as a logic cell then the grouped gates must have less than or equal to four inputs for successful mapping.

Embodiments of the present invention utilize cascade elements during the hardware description language (HDL) compilation and maps the design for programmable integrated circuits during technology mapping.

In the accompanying diagrams (FIG. 6, FIG. 7, FIG. 8) a hexagon represents a LUT, a circle represents a logic node, an arrow represents a connection, and a rectangle represents a cascade element.

Figure 1:
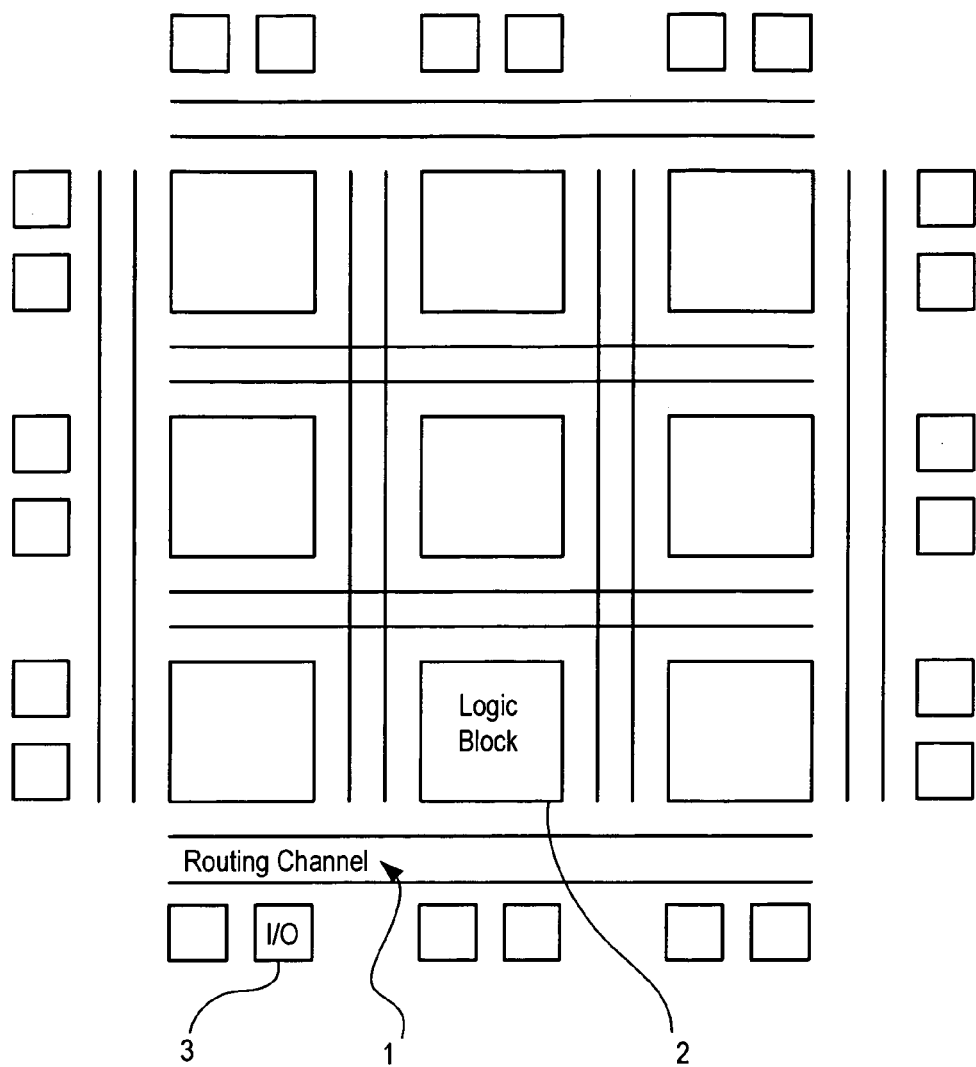
FIG. 1 shows a schematic diagram of a conventional Field Programmable Gate Array. (FPGA)

FIG. 1 is a functional block diagram of a typical LUT-based Field Programmable Gate Array. A typical FPGA has vertical/horizontal routing lines 1, an array of logic blocks 2 and interfacing I/O pads 3. The routing resources 1 connect the logic block elements 2 and I/O pads. The FPGA can also have switch boxes at the intersection of routing lines for connecting to the logic block arrays.

Figure 2:
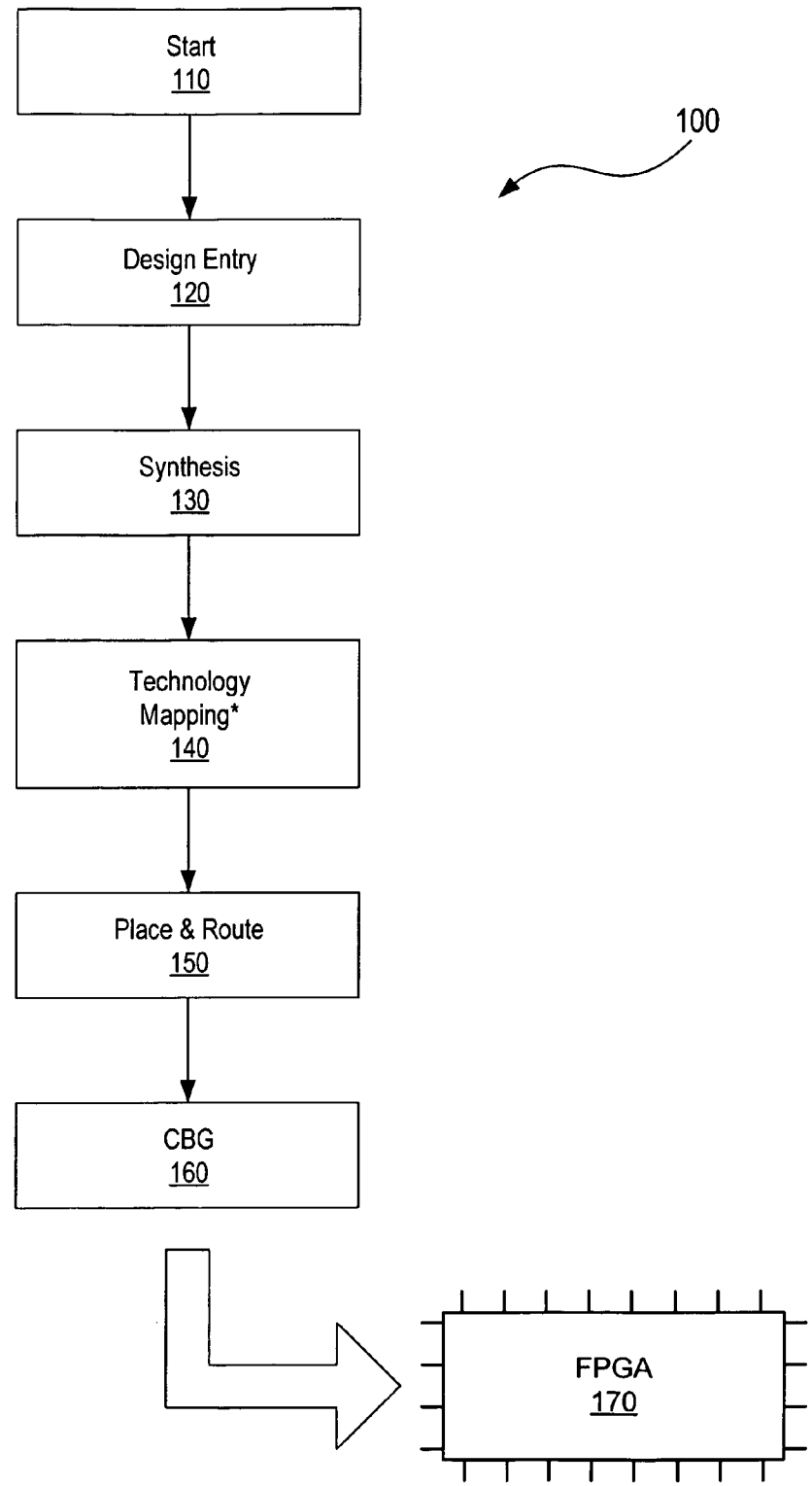
FIG. 2 shows a FPGA circuit implementation process according to one embodiment of this invention.

FIG. 2 shows the flow chart 100 of an electronic design compilation process. The process of compilation is started 110 by either clicking icons or by passing the command to start the compilation. Once the compilation is started the design entries 120 are entered by the user according to which the circuit is synthesized 130. The LUTs and the PLBs are then mapped 140 over the synthesized circuit. After proper placement of the elements and routing lines 150 the configuration bit is generated 160 and the logic is then configured on the FPGA 160. The compiler operates in accordance with user specifications. The user specifications can be in terms of timing requirements, area constraints or any other desired constraints., The compiler synthesizes the design to produce a net list, which describes the functionality of design for implementation on the programmable logic device. The net list can be the collection of gates, state machines & macros etc. The nodes of the net list are connected via nets and each net has a signal associated with it. The net list is synthesized to remove the redundant logic, and to meet specified constraints.

Figure 3:
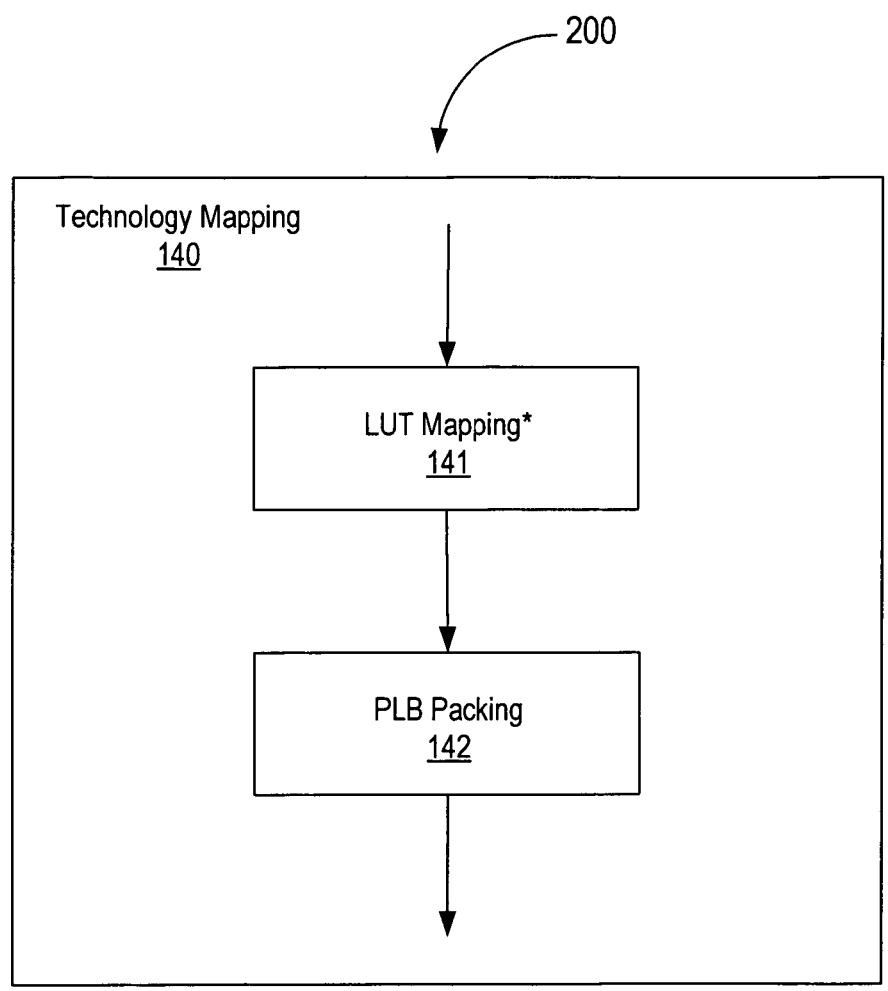
FIG. 3 shows the flow diagram of the technology-mapping step in the FPGA circuit implementation process of FIG. 2 according to an embodiment of this invention.

FIG. 3 shows a simplified block representation 200 of the technology mapping step 140 of the electronic design compilation. The technology mapping 140 can broadly be divided in two parts, LUT mapping 141 and PLB packing 142.

Figure 4:
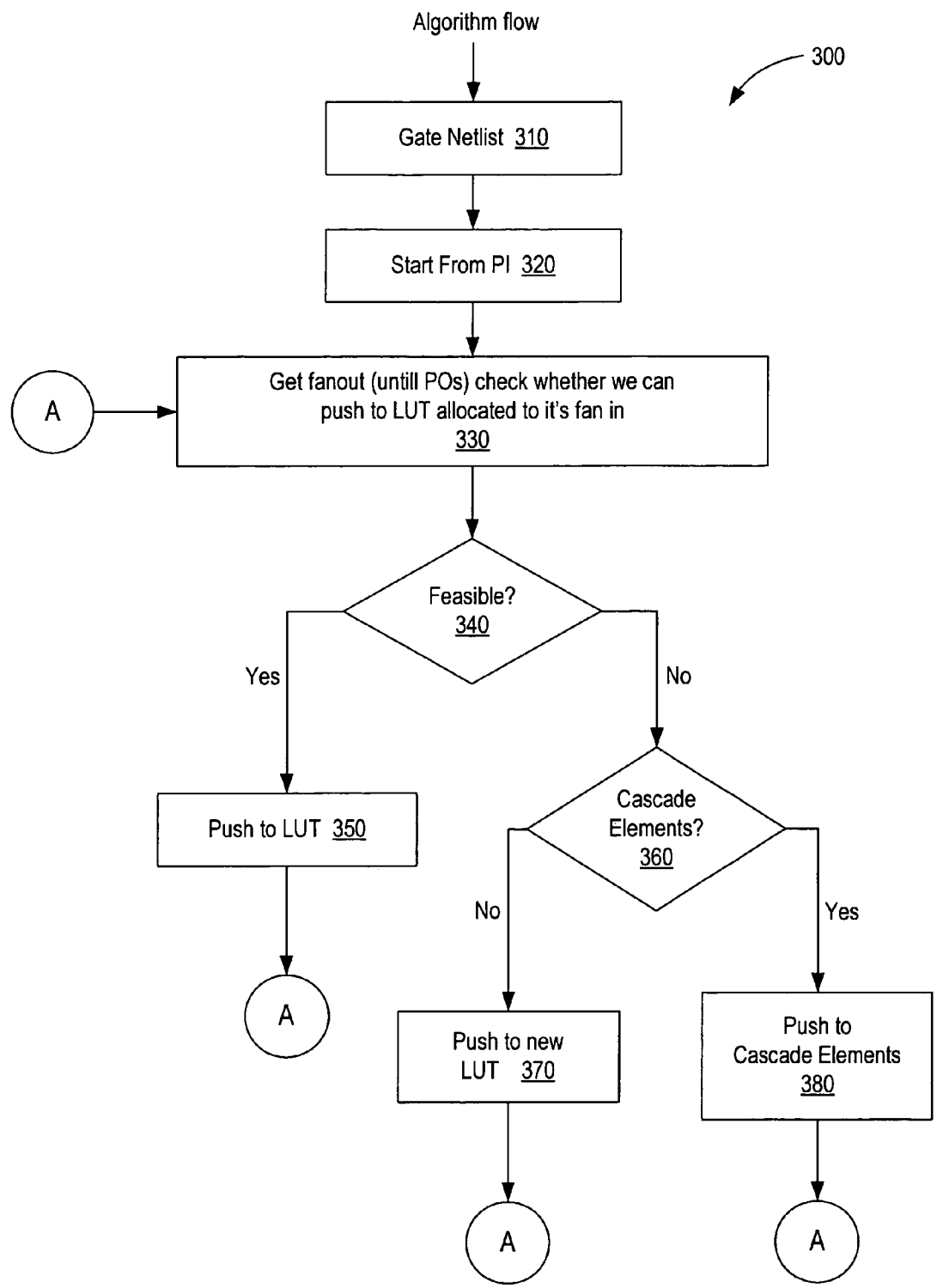
FIG. 4 shows a process flow diagram for LUT mapping step of FIG. 3 in the technology-mapping step in the FPGA circuit implementation process according to an embodiment of this invention.

FIG. 4 shows a flow chart of a LUT mapping process 300 according to one embodiment of the present invention. In this process the first step is to decompose the GATE netlist 310 into simple gates. The second step 320 establishes the feasibility of pushing additional logic without violating the specified constraints including the fan-out constraints 330, 340 in an LUT. If it is feasible to incorporate more logic onto the LUT then the logic is mapped accordingly 350, and the control returns to block 330. If it is not feasible to incorporate any additional logic onto the LUT then the feasibility of incorporating the cascade elements is established. If this is possible then appropriate logic elements are mapped onto the cascade elements in block 380 and control then returns to block 330. If the possibility does not exist then another LUT is selected in block 370 and the control are returns to block 330. The logic clusters are formed by grouping nodes. Whenever the cluster is k-infeasible, no more nodes are added to the cluster. Before starting a fresh cluster, the feasibility of incorporating the cascade element in the device architecture is determined. If the feasibility is established the next node is mapped to the cascade element. This decreases the block count for the logic. As the cascade elements are hard wired they do not use the routing resources and the resultant delay is less than that of a LUT.

Figure 5:
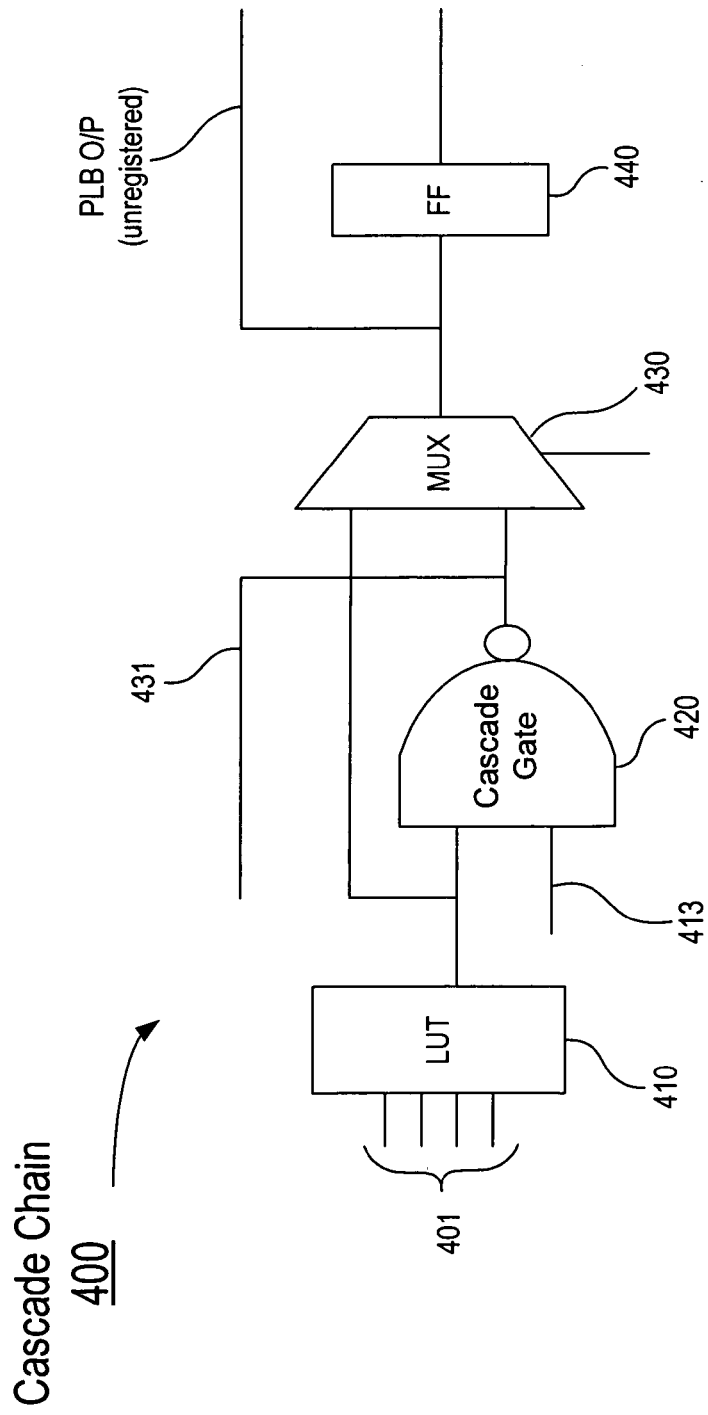
FIG. 5 shows a schematic diagram of a cascade element coupled with a LUT according to one embodiment of the present invention.

FIG. 5 shows a structure of a Programmable Logic Block (PLB) 400 in a LUT-based FPGA. LUT 410 having inputs 401, and cascade logic gate 420, is connected to multiplexer 430 having flip-flop 440 at its output. One of the inputs 413 to the cascade logic is from the cascade out of the previous stage and the output 431 of the cascade gate is the cascade in for the next stage.

Figure 6:
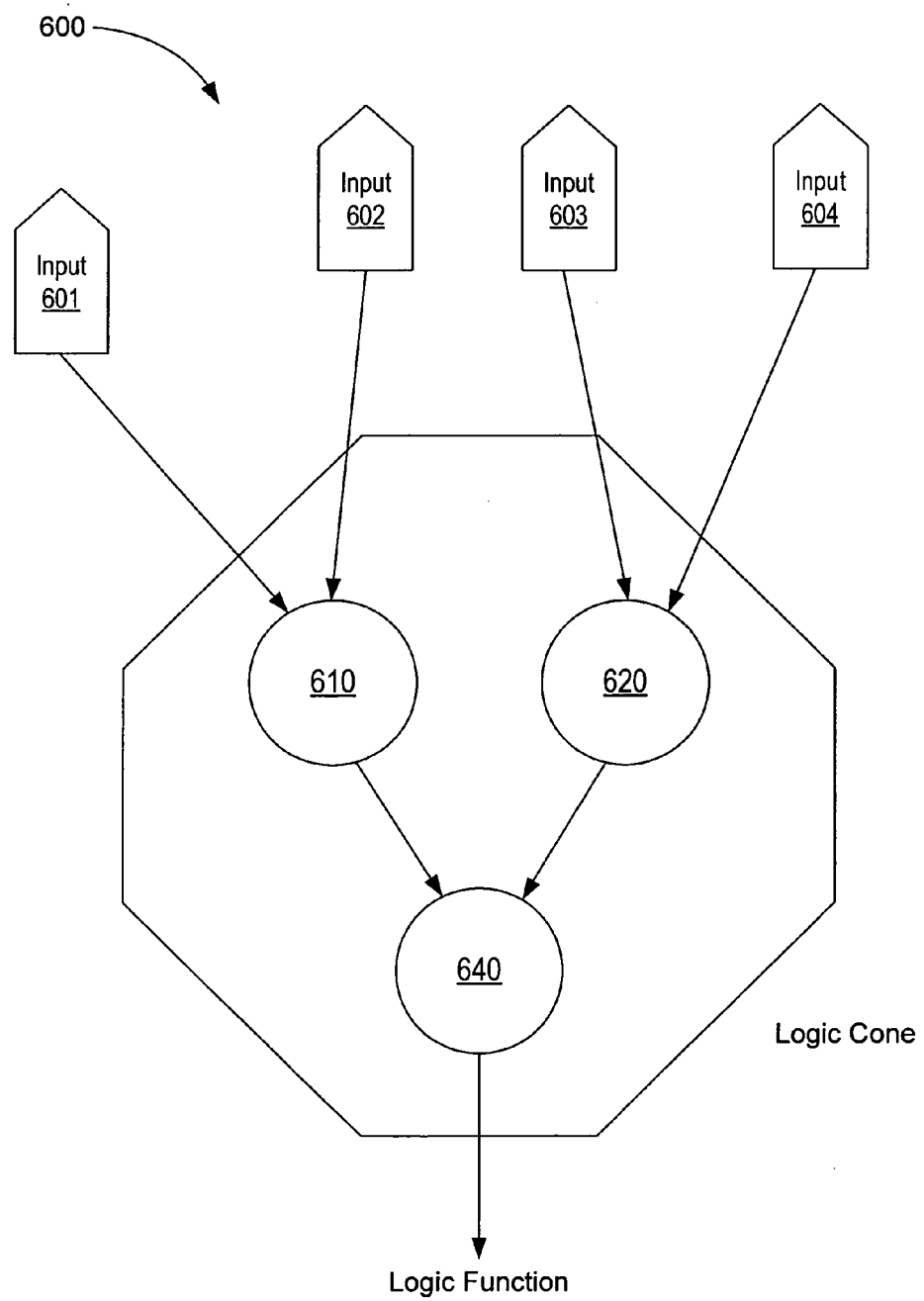
FIG. 6 shows a functional block diagram of a typical four input logic cone.

FIG. 6 is a functional diagram of a typical four input logic cone 600. The nodes 601, 602, 603, 604 are inputs from other logic cones or logic gates. Nodes 610, 620, 640 are logic gates, and the arrow represents the connection between the logic gates.

Figure 7:
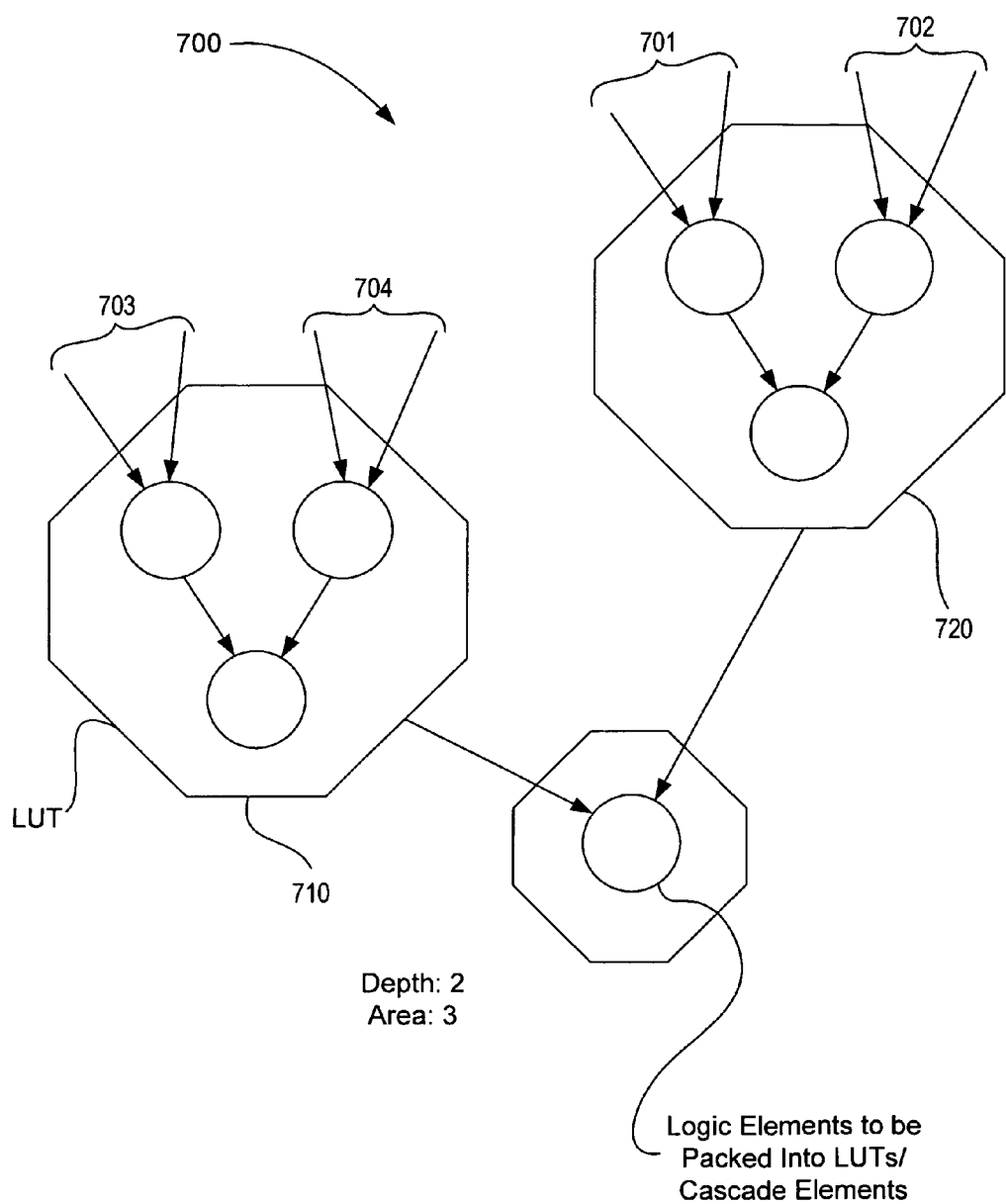
FIG. 7 shows a conventional net list mapped logic circuit without using the cascade feature of a programmable logic device.

FIG. 7 is a functional diagram 700 of a mapped netlist without using the cascade feature of the programmable logic device. Nodes 701, 702, 703, 704 etc. are the inputs from the other logic cones or logic gates, nodes 710, 720, etc. are the logic gates, and the arrow represents the connection between the logic gates.

Figure 8:
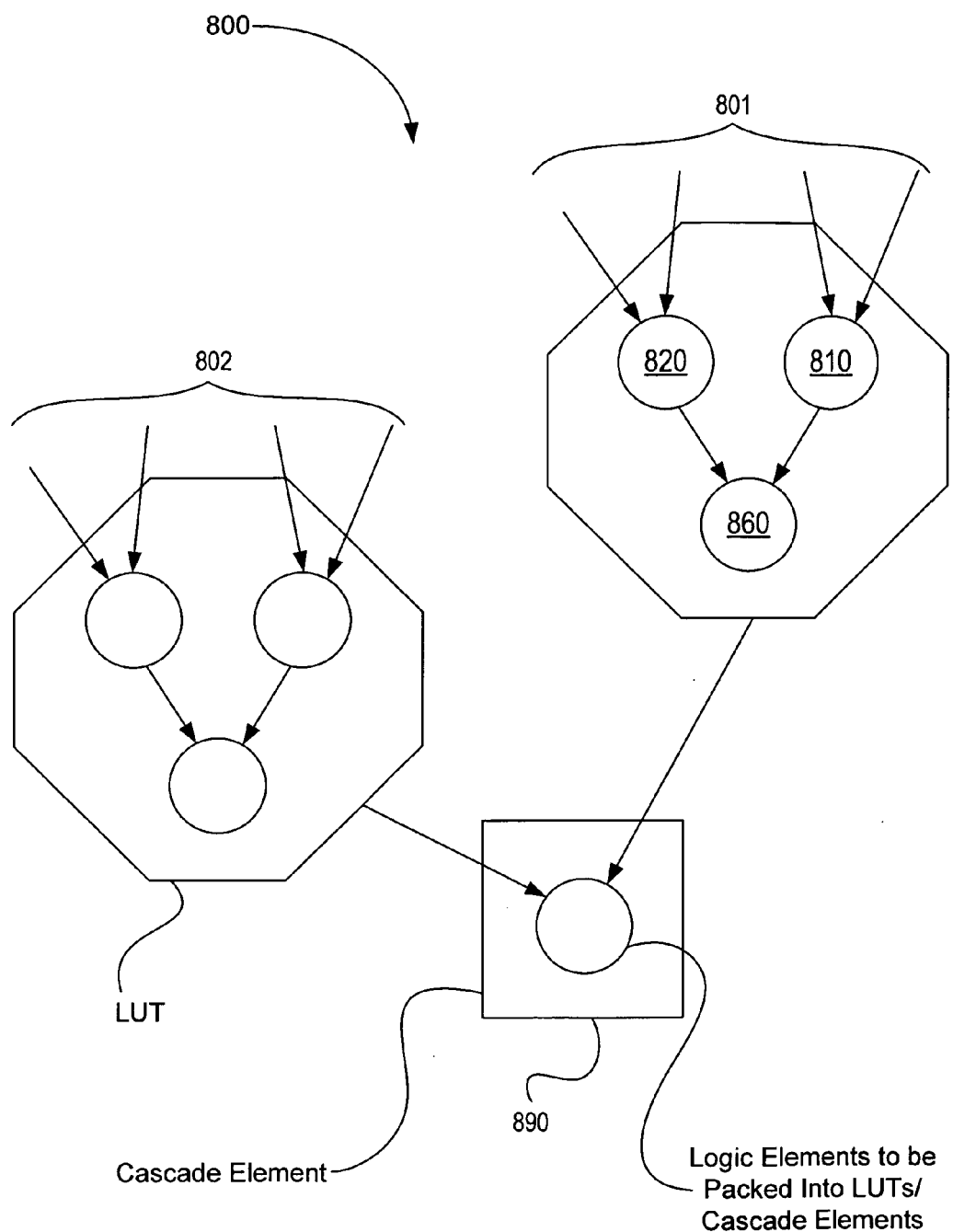
FIG. 8 shows a netlist mapping using the cascade feature of the programmable logic device in accordance with an embodiment of the present invention.

FIG. 8 shows a mapping of a netlist 800 using the cascade logic of the programmable logic device according to an embodiment of the current invention. The mapping is implemented according to predefined criteria. The criteria may be logic density, speed etc. In each case forming of cones is started from nodes e.g. 810, 820, 860 etc. whose fanins are already mapped or from the nodes which are primary inputs e.g. 801, 802, 811 etc. The maximum possible number of nodes is mapped onto each available LUT to increase the density of logic. Each node required to be mapped to an LUT is selected according to the speed criteria. If it is not possible to map any more nodes to an LUT, the feasibility of mapping the node to the cascade element 890 of the LUT is established. If the feasibility exists then the density of the logic implemented is increased as more logic of the same logic block is utilized. At the same time the speed of the implemented circuit also increases as the cascade elements 890 use hardwired connecting lines instead of the general routing resources of the FPGA.

Another method that can be applied for extracting the cascade chains is:
1. Prior to forming the LUTs the nodes (logic gates) to be mapped to the cascade elements are identified.
2. The entire netlist is then mapped to the LUTs without considering the cascade logic elements.
3. The identified nodes are then extracted from the mapped list as a post operation and mapped onto the cascade logic elements.

Since the cascade element is a single universal gate (NAND or NOR) certain constraints have to be observed while mapping gates onto the cascade element. These constraints can be divided into two groups.

1. Conditions that are to be verified when starting a new chain.
2. Constraints to be verified while the cascade chain is being formed.

The first group of conditions that need to be verified when starting a new cascade chain are:
1. The number of common inputs to the fan in LUTs of the cascade element should be more than four.
2. The gate implemented in cascade element should not be of type XOR, XNOR or NOT.
3. Either one of the fan in gates should be in the Cascade Element or none should be in cascade element.
4. Either the gate implemented in the Cascade Element or its input LUTs should be multi fan out, but not both.
5. If the output of the cascade element is a primary output then the gate implemented inside the cascade element should not be of type 'AND' or 'NOR' gate.

The second set of conditions that are needed to be verified while the cascade chain is being formed are:
1. The gate implemented in cascade element should not be of type XOR, XNOR or NOT.
2. Either one of the fan in gates should be in Cascade Element or none should be in the Cascade Logic.
3. Only one of either the gate implemented in the Cascade Logic or its input LUTs should be multi fan out.
4. If the output of the cascade element is a primary output then the gate implemented in the cascade element should not be of type 'AND' or 'NOR'.
5. If the cascade element is multi fan out then there should not be more than one cascade element in the fan out list.
6. If the LUT is multi fan out then there should not be more than one cascade element in the fan out list.

This process of utilizing the cascade elements while mapping a logic circuit onto target architecture is independent of the algorithm used for LUT synthesis. This method provides an optimal solution superior to existing methods without any extra traversal of the gate level netlist.

A programmable logic device programmed in accordance with the described embodiments of the present invention can be included in a variety of electronic systems, such as a computer system or an embedded system.

It will be apparent to those with ordinary skill in the art that the foregoing is merely illustrative and not intended to be exhaustive or limiting, having been presented by way of example only and that various modifications can be made within the scope of the present invention.

Accordingly, this invention is not to be considered limited to the specific examples chosen for purposes of disclosure, but rather to cover all changes and modifications, which do not constitute departures from the permissible scope of the present invention. The invention is therefore not limited by the description contained herein or by the drawings, but only by the claims.

We claim:

1. An improved method for mapping an electronic digital circuit to a Look Up table (LUT) based Programmable Logic Device (PLD) comprising the steps of:
    selecting an unmapped or partially mapped LUT,
    identifying a group of circuit elements for mapping based on an available capacity of the selected LUT and a plurality of mapping constraints,
    mapping the group of circuit elements onto the selected LUT,
    continuing the process of selecting an LUT, forming a group of circuit elements and mapping until all the circuit elements have been mapped, wherein the cascade logic associated with each LUT is also incorporated in the steps of forming the group of circuit elements and the mapping of the group; and wherein the cascade logic is incorporated only after either all circuit elements have initially been mapped onto LUTs or some circuit elements remain unmapped even after all LUTs have been utilized.

2. An improved method as claimed in claim 1 wherein said group of circuit elements are mapped to the cascade logic prior to mapping on the LUTs.

3. An improved method as claimed in claim 1 wherein the mapping constraints include timing constraints, placement constraints, and size constraints.

4. An improved method as claimed in claim 1 wherein the mapping on the Cascade logic incorporates one or more of the following constraints depending upon the connectivity of the architecture:

XOR, XNOR and NOT functions are not mapped on the cascade logic, only one of either the gate mapped onto the cascade logic or its input LUTs have multiple fan-outs, if the output of the cascade logic is a primary output, then the gate mapped onto it is not an 'AND' or 'NOR' gate, if the mapped gate has multiple fan outs then the outputs are not connected to more than one other gate mapped into a cascade logic element, and if the mapped gate connects to the output of a multi-fan out LUT then the output of the LUT is not connected to more than one cascade logic element.

5. An improved method as claimed in claim 1 including the verification of one or more of the following conditions at the initial mapping of the cascade logic chain depending upon the connections of the architecture:

the number of common inputs to the fan-in LUTs of the cascade logic is not greater than the number of inputs of the LUT, the gate mapped onto the cascade logic is not of the type XOR, XNOR or NOT, and only one of either the gates mapped on top the cascade logic or its input LUTs is multi fan.

6. An improved system for mapping an electronic digital circuit to a Look up table (LUT) based Programmable Logic Device (PLD) comprising:

selecting means for selecting an unmapped or partially mapped LUT, grouping means for clustering circuit elements for mapping based on an available capacity of the selected LUT and at least one mapping constraint, mapping means for mapping the group of circuit elements onto the selected LUT, and wherein the grouping means and mapping means include the mapping of cascade logic associated with the selected LUT after mapping of the group of circuit elements onto the LUT.

7. A method for mapping circuit elements into a programmable logic device including look-up tables and cascade elements, the method comprising:

selecting a look-up table;

identifying a group of circuit elements to be mapped into the selected look-up table;

mapping the identified group of circuit elements into the selected look-up table; determining whether additional circuit elements can be identified and mapped into the look-up table;

if the determination is that additional circuit elements can be mapped into the look-up table, mapping the additional circuit elements into the look-up table;

if the determination is that additional circuit elements cannot be mapped into the look-up table, determining whether the additional circuit elements can be mapped into a cascade element or elements;

if the determination is that the additional circuit elements can be mapped into a cascade element or elements, then mapping the additional circuit elements into the cascade element or elements;

if the determination is that the additional circuit elements cannot be mapped into the cascade element or elements, then selecting a new look-up table and mapping the circuit elements into the new look-up table; and repeating the operations of mapping the identified group of circuit elements into the selected look-up table through if the determination is that additional logic cannot be mapped into the cascade element or elements until all circuit elements have been mapped.

8. The method of claim 7 wherein circuit elements are mapped to the cascade logic prior to being mapped into the look-up tables.

9. The method of claim 7 further comprising:

identifying the circuit elements to be mapped to the cascade element or elements prior to mapping elements into the look-up tables;

mapping all circuit elements into the look-up tables without consideration of the cascade element or elements to generate a mapped list;

extracting from the mapped list the circuit elements to be mapped to the cascade element or elements; and mapping the identified circuit elements to the cascade element or elements.

10. The method of claim 7 wherein the operations of mapping the circuit elements are done in accordance with certain mapping constraints such as timing constraints, placement constraints, and size constraints.

11. The method of claim 7 wherein circuit elements comprise NAND or NOR gates that are mapped to the cascade elements.

12. A method for programming a programmable logic device including look-up tables and cascade elements, the method comprising:

mapping logic into the look-up tables;

mapping logic into the cascade elements;

repeating the operations of mapping logic into the look-up tables and mapping logic into the cascade elements until all logic has been mapped into the programmable logic device;

identifying logic to be mapped to the cascade elements prior to mapping logic into the look-up tables;

mapping all logic into the look-up tables to generate a mapped list; and extracting from the mapped list the logic to be mapped into the cascade elements; and mapping the identified logic to the cascade elements.

13. The method of claim 12 wherein the mapping of logic is done in accordance with certain mapping constraints such as timing constraints, placement constraints, and size constraints.

14. An electronic system for programming a programmable logic device, the programmable logic device including look-up tables and including cascade elements, and the electronic system comprising:

a selection circuit operable to select look-up tables within the programmable logic device;

a logic grouping circuit coupled to the selection circuit and operable to select and group logic as a function of the available capacity of a selected look-up table; and a mapping circuit coupled to the selection and logic grouping circuits and operable to map grouped logic into the selected look-up table and into the cascade elements as a function of the available capacity of the selected look-up table, the cascade logic being mapped after the grouped logic is mapped into the selected look-up table.

15. The electronic system of claim 14, wherein the programmable logic device comprises a field programmable gate array.

16. The electronic system of claim 14, wherein the electronic system comprises a computer system.

17. The electronic system of claim 14, wherein the mapping circuit operates to map grouped logic into cascade elements only when a selected look-up table is full and further operates to select a new look-up table when grouped logic cannot be mapped into the currently selected look-up table or the cascade elements.

18. The electronic system of claim 14 wherein each programmable logic device comprises logic block circuitry, input/output circuitry, and routing channel circuitry.

* * * * *